United States Patent
Schuegraf et al.

(10) Patent No.: US 6,611,032 B2
(45) Date of Patent: Aug. 26, 2003

(54) METHODS FOR FORMING WORDLINES, TRANSISTOR GATES, AND CONDUCTIVE INTERCONNECTS, AND WORDLINE, TRANSISTOR GATE, AND CONDUCTIVE INTERCONNECT STRUCTURES

(75) Inventors: Klaus Florian Schuegraf, Fountain Hills, AZ (US); Carl Powell, Boise, ID (US); Randhir P. S. Thakur, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/879,742

(22) Filed: Jun. 11, 2001

(65) Prior Publication Data

US 2001/0035541 A1 Nov. 1, 2001

(Under 37 CFR 1.47)

Related U.S. Application Data

(62) Division of application No. 09/333,770, filed on Jun. 15, 1999.

(51) Int. Cl.⁷ .......................... H01L 29/76; H01L 29/94; H01L 29/167
(52) U.S. Cl. ................ 257/412; 257/288; 257/315; 257/385; 257/413; 257/611
(58) Field of Search ................. 257/385, 412, 257/413, 611, 288, 315

(56) References Cited

U.S. PATENT DOCUMENTS

| 4,354,309 A | 10/1982 | Gardiner et al. |
| 4,559,091 A | 12/1985 | Allen et al. |
| 4,700,215 A | * 10/1987 | McPherson .................. 257/755 |
| 4,833,099 A | 5/1989 | Woo |
| 4,886,765 A | 12/1989 | Chen et al. |
| 5,047,831 A | * 9/1991 | Katayama .................. 257/734 |
| 5,053,351 A | 10/1991 | Fazan et al. |

(List continued on next page.)

FOREIGN PATENT DOCUMENTS

| JP | 401276761 A | 4/1988 |
| JP | 402265248 A | 10/1990 |

OTHER PUBLICATIONS

Wolf, "Silicon Processing for the VLSI ERA vol. 1: Process Technology", 1986, pp. 384–385.*

Ku, Lee, Ting, Kwong, IEEE Xplore, "The application of ion–beam mixing, doped silicde, and rapid thermal processing self–aligned silicide technology", VLSI Technology, System and Application, 1989, pp. 337–341.

H. Lange, "Physical properties of semiconducting transition metal silicides and their prospects in SI–based device applications", IEEE, 1998.

(List continued on next page.)

Primary Examiner—Matthew Smith
Assistant Examiner—Lex H. Malsawma
(74) Attorney, Agent, or Firm—Wells St. John P.S.

(57) ABSTRACT

The invention encompasses stacked semiconductor devices including gate stacks, wordlines, PROMs, conductive interconnecting lines, and methods for forming such structures. The invention also includes a method of forming a transistor gate comprising: a) forming gate dielectric layer; b) forming a polysilicon gate layer against the gate dielectric layer; and c) doping the polysilicon gate layer with a conductivity-enhancing dopant, the dopant being provided in a concentration gradient within the polysilicon layer, the concentration gradient increasing in a direction toward the gate dielectric layer. The invention also includes a wordline comprising: a) a polysilicon line; a substantially fluorine impervious barrier layer over the polysilicon line; and a b) layer of metal-silicide over the substantially fluorine impervious barrier layer.

16 Claims, 10 Drawing Sheets

U.S. PATENT DOCUMENTS

| | | | |
|---|---|---|---|
| 5,093,700 A | | 3/1992 | Sakata |
| 5,164,333 A | * | 11/1992 | Schwalke et al. ............ 438/303 |
| 5,192,708 A | | 3/1993 | Beyer et al. |
| 5,208,182 A | | 5/1993 | Narayan et al. |
| 5,256,894 A | * | 10/1993 | Shino .......................... 257/388 |
| 5,350,698 A | * | 9/1994 | Huang et al. ................ 438/305 |
| 5,355,010 A | | 10/1994 | Fujii et al. |
| 5,364,803 A | | 11/1994 | Lur et al. |
| 5,393,676 A | | 2/1995 | Anjum et al. |
| 5,393,685 A | | 2/1995 | Yoo et al. |
| 5,425,392 A | | 6/1995 | Thakur et al. |
| 5,439,833 A | | 8/1995 | Hebert et al. |
| 5,441,904 A | * | 8/1995 | Kim et al. ................... 438/592 |
| 5,472,896 A | | 12/1995 | Chen et al. |
| 5,481,128 A | * | 1/1996 | Hong .......................... 257/320 |
| 5,650,648 A | | 7/1997 | Kapoor ....................... 257/316 |
| 5,652,156 A | * | 7/1997 | Liao et al. ................... 438/161 |
| 5,710,454 A | | 1/1998 | Wu |
| 5,712,181 A | | 1/1998 | Byun et al. |
| 5,723,893 A | | 3/1998 | Yu et al. ...................... 257/413 |
| 5,767,004 A | * | 6/1998 | Balasubramanian et al. .......................... 438/592 |
| 5,767,558 A | | 6/1998 | Lo et al. |
| 5,798,296 A | | 8/1998 | Fazan et al. |
| 5,811,343 A | | 9/1998 | Wann et al. |
| 5,818,092 A | * | 10/1998 | Bai et al. ..................... 257/388 |
| 5,840,607 A | * | 11/1998 | Yeh et al. .................... 438/257 |
| 5,861,340 A | * | 1/1999 | Bai et al. ..................... 438/592 |
| 5,877,074 A | | 3/1999 | Jeng et al. |
| 5,915,197 A | | 6/1999 | Yamanaka et al. |
| 5,930,655 A | * | 7/1999 | Cooney, III et al. ......... 438/474 |
| 5,985,720 A | | 11/1999 | Saitoh |
| 5,986,312 A | | 11/1999 | Kuroda ....................... 257/382 |
| 6,040,238 A | | 3/2000 | Yang et al. |
| 6,060,741 A | * | 5/2000 | Huang ........................ 257/315 |
| 6,066,577 A | * | 5/2000 | Cooney, III et al. ......... 438/787 |
| 6,130,145 A | | 10/2000 | Ilg et al. ..................... 438/592 |
| 6,208,004 B1 | * | 3/2001 | Cunningham ............... 257/413 |
| 6,214,730 B1 | * | 4/2001 | Cooney, III et al. ......... 438/681 |
| 6,239,458 B1 | * | 5/2001 | Liaw et al. .................. 257/296 |
| 6,262,458 B1 | | 7/2001 | Hu .............................. 257/384 |
| 6,310,300 B1 | * | 10/2001 | Cooney, III et al. ......... 174/258 |

OTHER PUBLICATIONS

Mogami, Wakabayashi, et al. "Low–resistance self–aligned Ti–silicide technology for sub–quarter Micron CMOS devices", 1996 IEEE.

Kubota, T., "The Effect of the Floating Gate/Tunnel $SiO_2$ Interface on FLASH Memory Data Retention Reliability", ULSI Device Development Laboratories, NEC Corp. 2 pages.

Wang, S. "Effects of Poly Depletion on the Estimate of Thin Dielectric Lifetime", 1991 IEEE Electron Device Letters. vol. 12, No. 11, Nov. 1991, pp. 617–619.

Schuegraf, "Impact of Polysilicon Depletion in Thin Oxide MOS Technology", 1993 VLSITSA.

Snow and Deal, "Polarization Phenomena and Other Properties of Phosphosilicate Glass Films on Silicon", Journal of the Electrochemical Society, vol.113, No. 3, Mar. 1968, pp. 263–269.

* cited by examiner

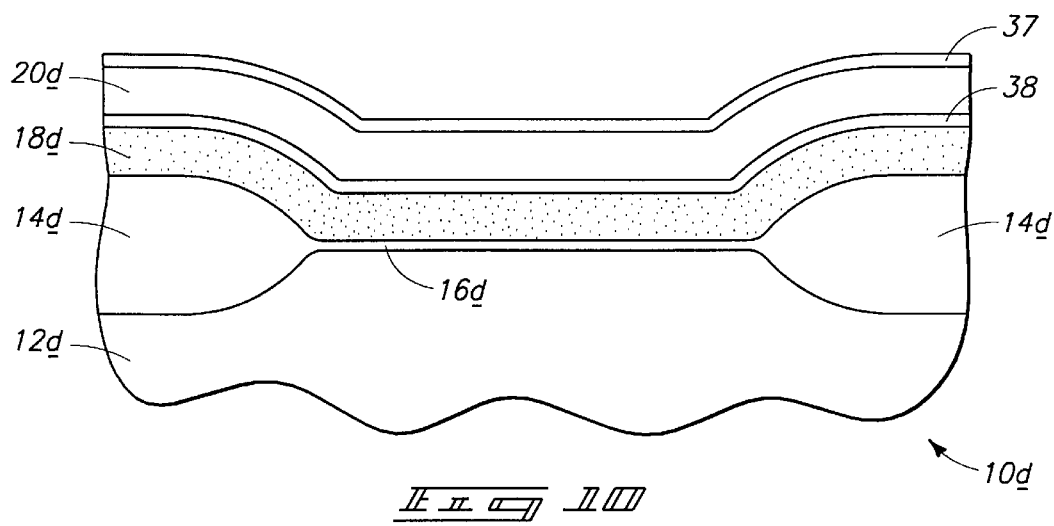
_Fig. 10_
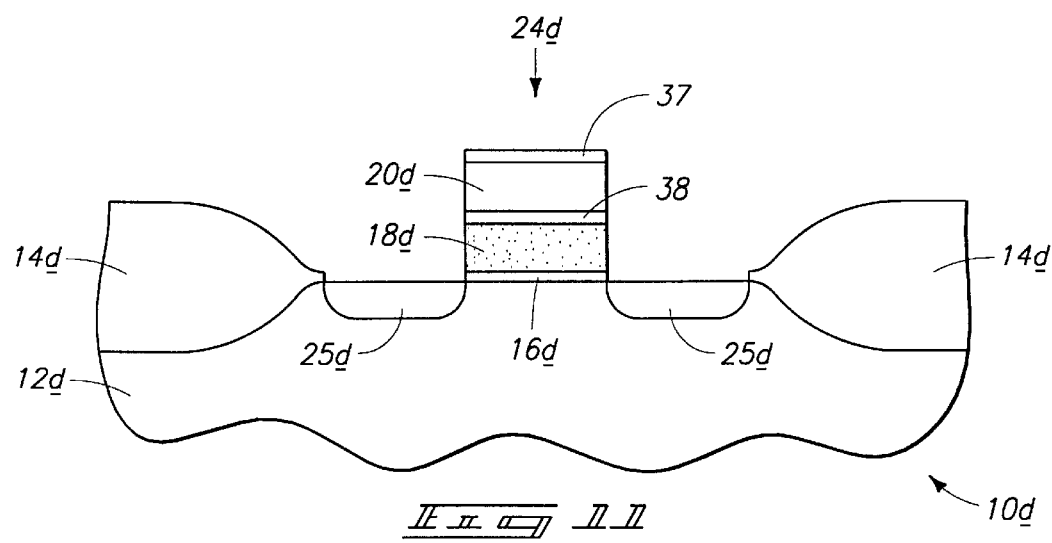
_Fig. 11_

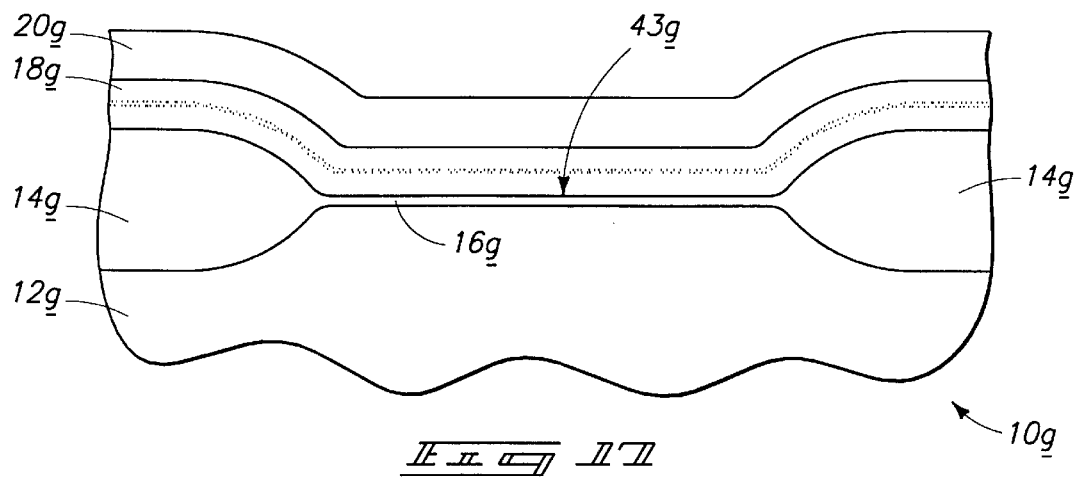
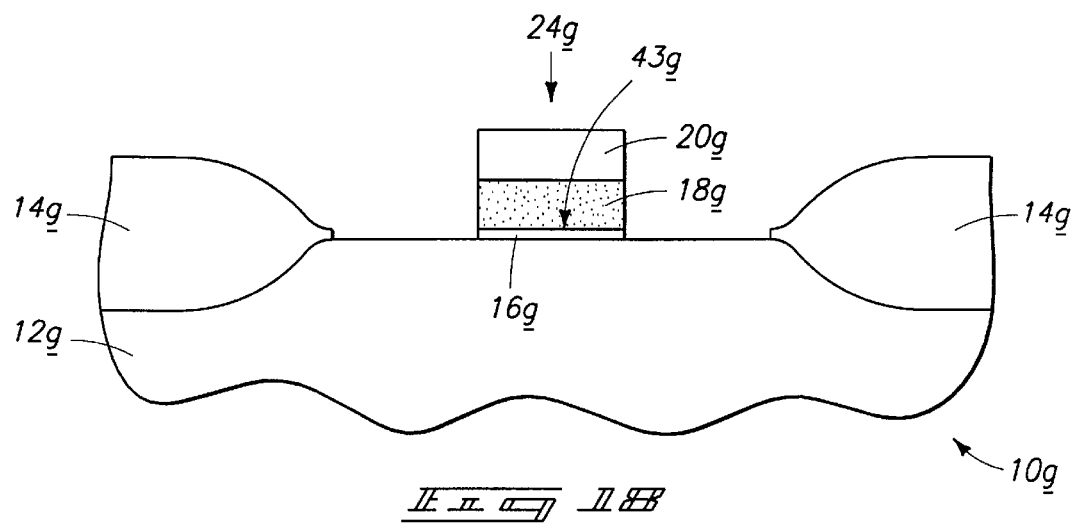

METHODS FOR FORMING WORDLINES, TRANSISTOR GATES, AND CONDUCTIVE INTERCONNECTS, AND WORDLINE, TRANSISTOR GATE, AND CONDUCTIVE INTERCONNECT STRUCTURES

RELATED PATENT DATA

This patent resulted from a divisional application of U.S. patent application Ser. No. 09/333,770, filed Jun. 15, 1999.

TECHNICAL FIELD

The invention pertains to a number of semiconductor structures and methods for forming such structures, including gate stack structures, conductive line structures, conductive interconnect structures, and programmable-read-only-memory devices.

BACKGROUND OF THE INVENTION

A continuous challenge in semiconductor processing is to improve conductivity and performance of stacked semiconductor structures. Among the stacked semiconductor structures commonly utilized are gate stacks, wordlines, programmable-read-only-memory devices such as EPROMs and EEPROMs, and conductive interconnects. Formation of some of these prior art stacked structures is described with reference to FIGS. 1–4. FIGS. 1–2 pertain to the formation of a wordline or gate stack structure, and FIGS. 3–4 pertain to the formation of a programmable-read-only memory device.

Referring to FIG. 1, a semiconductor wafer fragment 10 is illustrated at a preliminary processing step of a prior art process for forming a wordline or gate stack. Wafer fragment 10 comprises a semiconductive material substrate 12, and field oxide regions 14 over substrate 12. A gate dielectric layer 16, generally comprising silicon dioxide, extends between field oxide regions 14. A polysilicon layer 18 and a polycide (silicide) layer 20 are formed over field oxide regions 14 and gate dielectric layer 16.

Polysilicon layer 18 typically comprises polysilicon uniformly doped with a conductivity enhancing dopant (illustrated by stippling within layer 18). Polycide layer 20 comprises a metal silicide, such as tungsten silicide, molybdenum silicide, titanium silicide or cobalt silicide. The formation of polycide layer 20 typically comprises depositing a metal over polysilicon layer 18 and reacting the metal with polysilicon layer 18 to form a metal-silicide. The reacting can comprise thermal processing of the metal layer and polysilicon layer at, for example, temperatures of from about 600° C. to about 800° C.

Referring to FIG. 2, layers 16, 18 and 20 are patterned to form a conductive stack, and specifically to form a wordline 24. Source/drain regions 25 are provided proximate wordline 24. Conductive wordline 24 comprises a transistor gate electrically connecting source/drain regions 25. The final transistor structure can be either a p-channel transistor (PMOS), or an n-channel transistor (NMOS), and can be incorporated within a CMOS construction.

The speed of devices comprising wordlines and conductive gates generally increases with increasing conductivities of the wordlines and conductive gates. Accordingly, it would be desirable to improve the conductivity of wordlines and transistor gates. A method for improving the conductivity of a doped layer is to "activate" the dopant within the layer. Although the chemistry of dopant activation is not well understood, activation is thought to occur as dopant is dispersed from grain boundaries in a polysilicon layer to bulk polysilicon away from the grain boundaries. Dopants are typically activated by thermal processing.

Alternative procedures similar to those of FIGS. 1 and 2 can be used to form a conductive polysilicon interconnect. Such interconnects can comprise a line of polycide over a polysilicon. Accordingly, such interconnects are similar to wordline 24, but lack dielectric layer 16.

The speed of devices comprising conductive interconnects can increase with increasing conductivities of the conductive interconnects. Accordingly, it would be desirable to improve the conductivity of conductive interconnects.

Referring to FIGS. 3–4, a prior art process for forming a programmable-read-only memory (PROM) device is illustrated. In the embodiment of FIGS. 3–4, similar numbering to that of the embodiment of FIGS. 1–2 is utilized, with differences indicated by the suffix "a", or by different numbers.

Referring to FIG. 3, a wafer fragment 10a is illustrated at a preliminary step during formation of a programmable-read-only memory device. Wafer fragment 10a comprises a semiconductive material 12a over which is formed field oxide regions 14a and gate dielectric layer 16a. A first polysilicon layer 18a is formed over regions 14a and dielectric layer 16a. A second dielectric layer 26 and a second polysilicon layer 28 are formed over first polysilicon layer 18a, and a polycide layer 30 is formed over second dielectric layer 26.

Polysilicon layers 18a and 28 comprise uniformly doped polysilicon, typically comprising a dopant concentration of greater than $1 \times 10^{19}$ ions/cm$^3$.

Referring to FIG. 4, layers 16a, 18a, 20a, 26, 28 and 30 are patterned to form the resulting PROM device 32. Within device 32, the patterned first polysilicon layer 18a is typically referred to as a floating gate. The patterned second polysilicon layer 28 and polycide layer 30 together comprise a conductive line 33.

The speed of circuits comprising PROM devices can increase with increasing conductivities of the conductive line and floating gate. Accordingly, it would be desirable to improve the conductivities of conductive lines and floating gates.

SUMMARY OF THE INVENTION

The invention encompasses stacked semiconductor devices including gate stacks, wordlines, PROMs, conductive interconnecting lines, and methods for forming such structures.

The invention includes a method of forming a transistor gate. A gate dielectric layer is formed and a polysilicon gate layer is formed against the gate dielectric layer. The polysilicon gate layer is doped with a conductivity-enhancing dopant. The dopant is provided in a concentration gradient within the polysilicon layer which increases in a direction toward the gate dielectric layer.

The invention also includes a wordline comprising a polysilicon line, a substantially fluorine impervious barrier layer over the polysilicon line, and a layer of metal-silicide over the substantially fluorine impervious barrier layer.

BRIEF DESCRIPTION OF THE DRAWINGS

Preferred embodiments of the invention are described below with reference to the following accompanying drawings.

FIG. 10 illustrates a semiconductor wafer fragment at preliminary step of a second embodiment method of the present invention for forming a wordline.

FIG. 11 illustrates the FIG. 10 wafer fragment at a step subsequent to that of FIG. 10.

FIG. 17 illustrates a semiconductor wafer fragment at preliminary step of a fifth embodiment method of the present invention for forming a wordline.

FIG. 18 illustrates the FIG. 17 wafer fragment at a step subsequent to that of FIG. 17.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

A first embodiment of the present invention is described with reference to FIGS. 5–9. In describing the first embodiment, like numerals from the preceding discussion of the prior art are utilized where appropriate, with differences being indicated by the suffix "c" or with different numerals.

Figure 1:
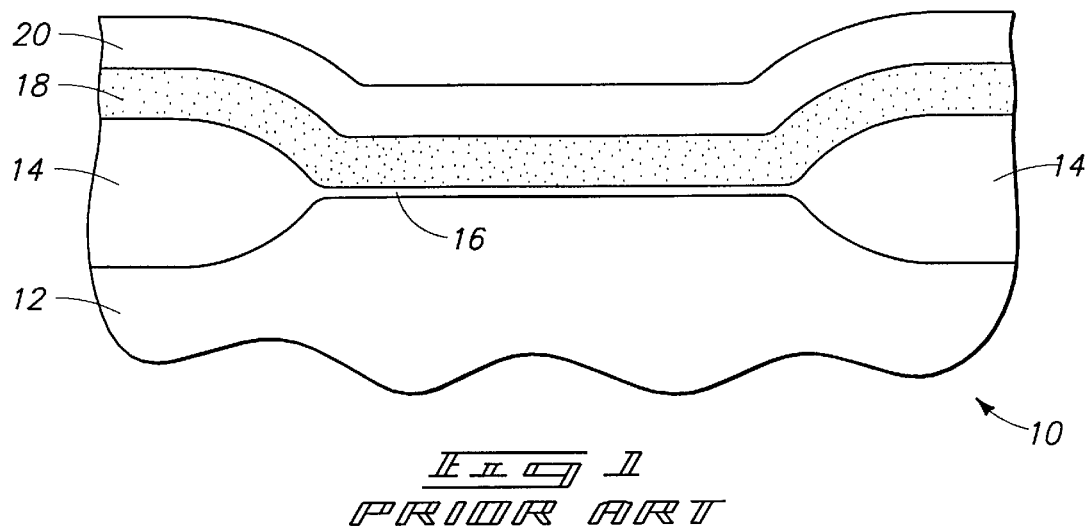
FIG. 1 illustrates a semiconductor wafer fragment at preliminary step of a prior art method for forming a wordline.
Figure 2:
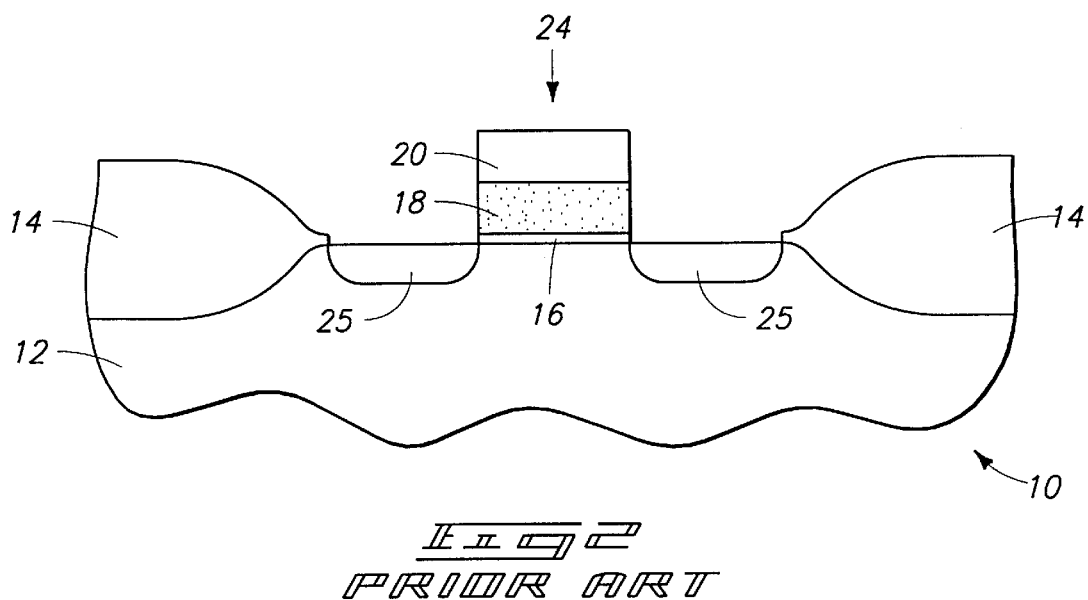
FIG. 2 illustrates the FIG. 1 wafer fragment at a prior art step subsequent to that of FIG. 1.
Figure 3:
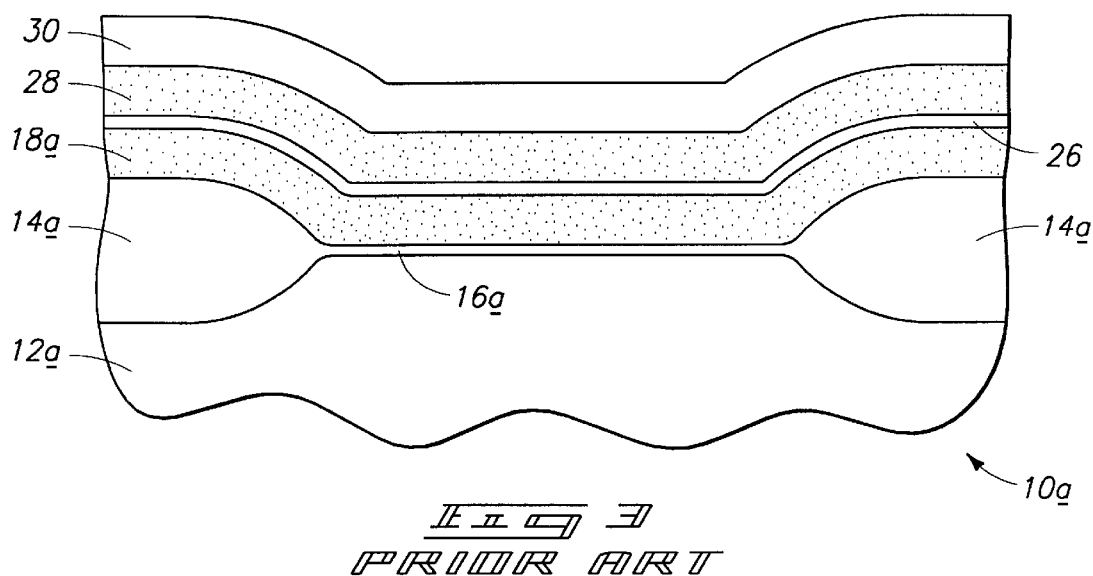
FIG. 3 illustrates a semiconductor wafer fragment at preliminary step of a prior art method for forming PROM device.
Figure 4:
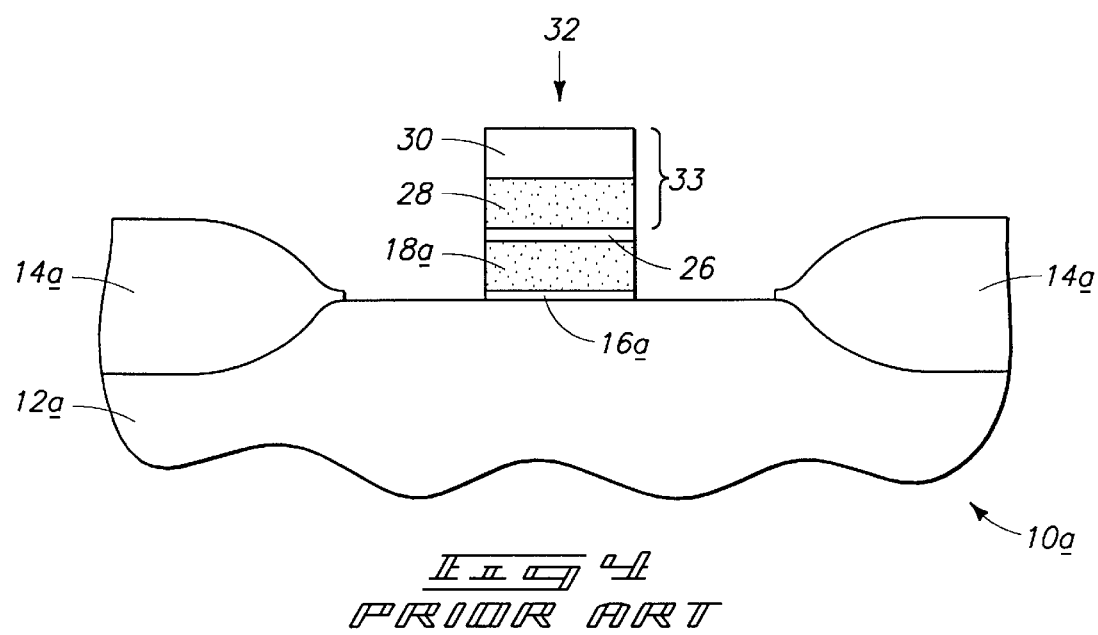
FIG. 4 illustrates the FIG. 3 wafer fragment at a prior art step subsequent to that of FIG. 3.
Figure 5:
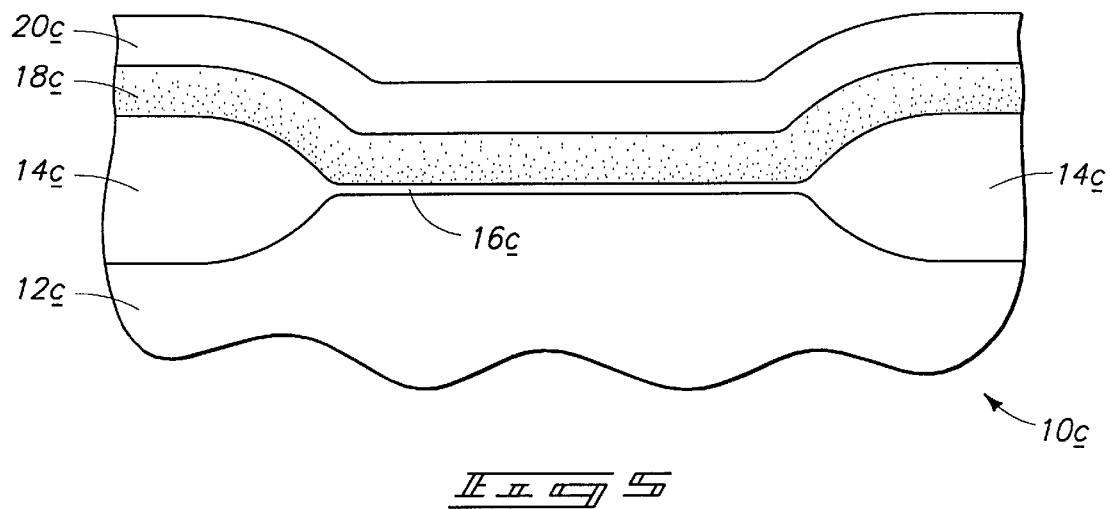
FIG. 5 illustrates a semiconductor wafer fragment at preliminary step of a first embodiment method of the present invention for forming a wordline.

Referring to FIG. 5, a semiconductor wafer fragment 10c is illustrated at a preliminary step of a semiconductor processing method. Fragment 10c comprises a semiconductive material substrate 12c. Field isolation regions 14c and a gate dielectric layer 16c are formed over substrate 12c. A polysilicon layer 18c is formed over field isolation regions 14c and gate dielectric layer 16c. A polycide layer 20c is formed over polysilicon layer 16c. Substrate 12c can comprise silicon. Field isolation regions 14c and dielectric layer 16c can comprise silicon dioxide. Polycide layer 20c comprises a metal silicide, and can comprise a metal selected from the group consisting of tungsten, molybdenum, cobalt, tantalum and titanium.

Polysilicon layer 18c comprises a conductivity-enhancing dopant provided in a concentration gradient. As shown by the stippling of FIG. 5, the concentration gradient is such that an amount of conductivity enhancing dopant decreases with increasing elevation within polysilicon layer 18c. In other words, the dopant concentration increases in a direction toward gate dielectric layer 18c. Accordingly, the dopant concentration decreases in a direction toward metal silicide layer 20c.

Several methods can be utilized to form the shown concentration gradient within layer 18c. An example method is a controlled ion implantation of conductivity-enhancing dopant into layer 18c such that the dopant concentration is greatest at elevationally lower depths of layer 18c than at elevationally upper depths of 18c. An example method would include implanting arsenic to a dose of $2 \times 10^{-15}$ cm$^{-2}$ throughout layer 18c, and then implanting an additional dose of $2 \times 10^{-15}$ cm$^{-2}$ arsenic at the lower depths of layer 18c.

Figure 9:
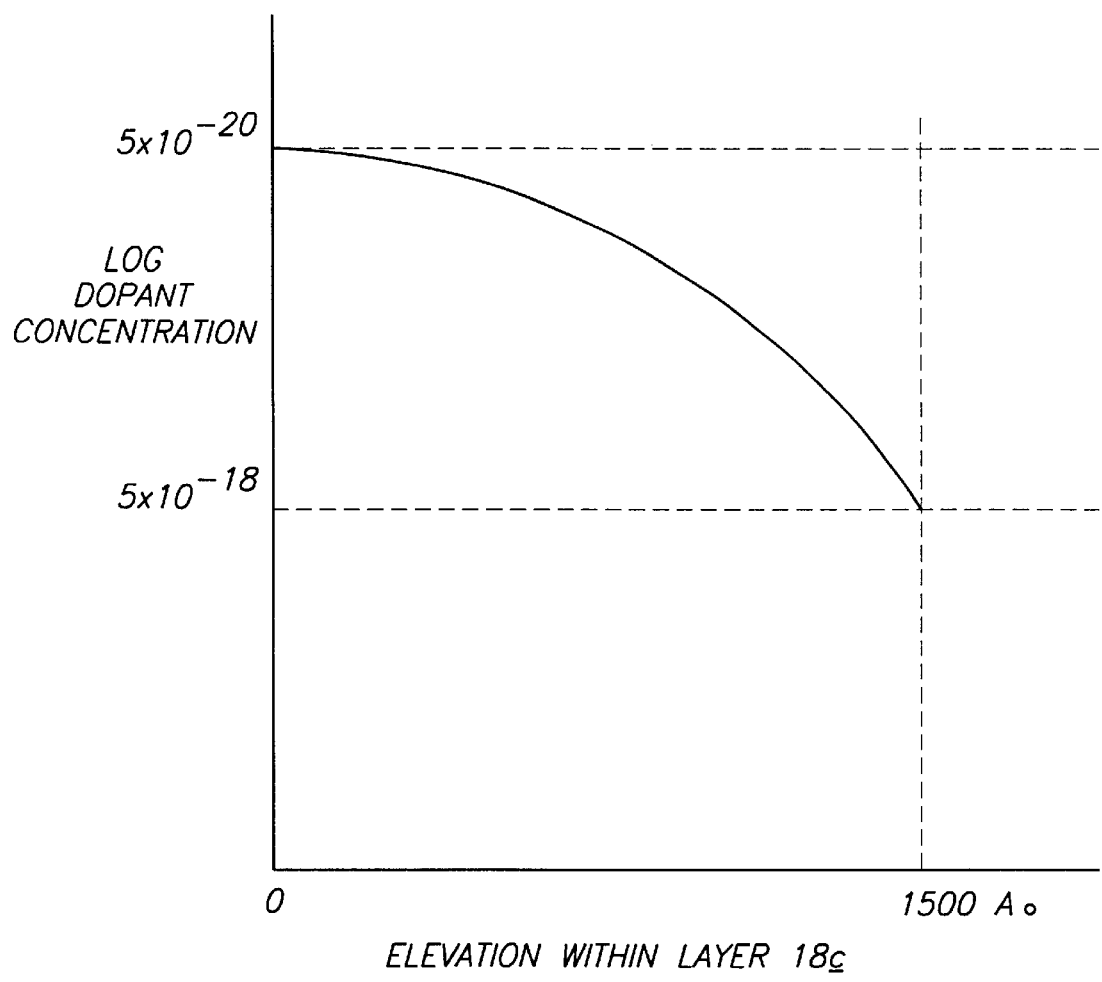
FIG. 9 illustrates a graph of dopant concentration verses elevation for an exemplary polysilicon layer doped according to a method of the present invention.

Another example method for forming a concentration gradient within layer 18c is to provide dopant at a lower elevation within layer 18c and subsequently diffuse the dopant within layer 18c. For instance, layer 18c can be doped to a concentration of $5 \times 10^{20}$ ions/cm$^3$ with phosphorus at the interface with 18c and to a concentration of $5 \times 10^{18}$ ions/cm$^3$ at higher elevations. An exemplary gradient is shown in FIG. 9 for a layer 18c that is 1500 Å thick.

Figure 6:
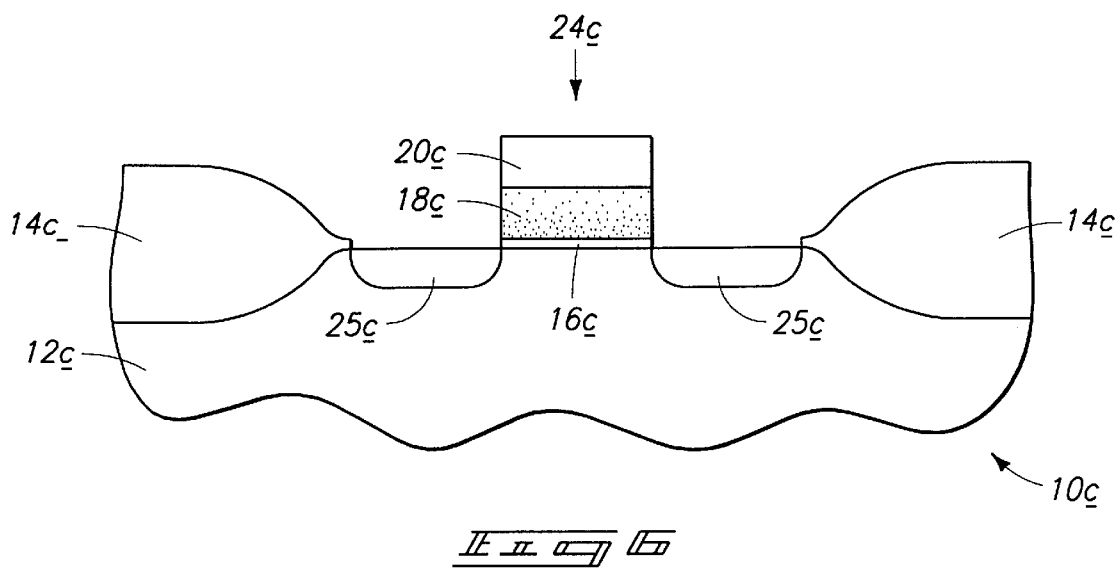
FIG. 6 illustrates the FIG. 5 wafer fragment at a step subsequent to that of FIG. 5.

Referring to FIG. 6, layers 18c, 18c and 20c are patterned to form a conductive wordline 24c. Source/drain regions 25c are provided adjacent conductive line 24c, with conductive wordline 24c comprising a transistor gate which electrically couples source/drain regions 25c. The resulting transistor structure can be a PMOS transistor or NMOS transistor, and can be incorporated into a CMOS.

Although layer 18c is doped before the patterning of wordline 24c in the shown embodiment, the invention encompasses alternative embodiments in which layer 18c is doped after such patterning.

Wordline 24c will preferably be transformed to a lower resistivity state by subsequent processing. Such subsequent processing could include, for example, rapid thermal processing (RTP). In the context of this document, RTP is defined to refer to temperature ramp rate of greater than about 7° C./second. Preferably, the RTP of wordline 24c is to a temperature of greater than 850° C. (such as, for example, a temperature of from 1000° C. to about 1025° C.). The temperature will preferably be maintained over 850° C. for a time of longer than 10 seconds, and generally between 10 seconds and 30 seconds, to activate the dopant within layer 18c. Such thermal processing can also advantageously induce grain growth of tungsten silicide. After the thermal processing, the dopant can be uniformly distributed throughout polysilicon layer 18c, or can, as shown, remain in a concentration gradient which decreases with increasing elevation.

The graded dopant concentration of FIGS. 5 and 6 can reduce a likelihood of dopant migrating into layer 20c, and can thereby reduce a likelihood of dopant poisoning grain growth within layer 20c. Accordingly, the graded dopant within layer 18c can reduce a peak temperature required for creating a low resistivity wordline 24c. In particular applications, the graded dopant concentration in layer 18c can be used either to realize the same low resistivity for a lower process temperature (which is desirable due to a lower thermal budget) or to realize a lower resistivity for the same process temperature sequence.

Figure 7:
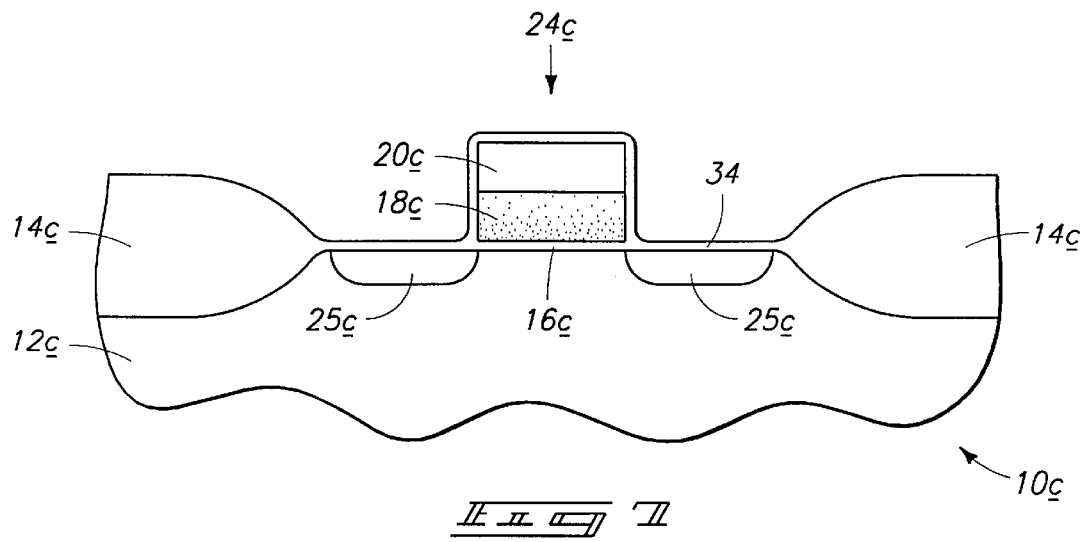
FIG. 7 illustrates the FIG. 5 wafer fragment at a step subsequent to that of FIG. 6.

Referring to FIG. 7, an oxide layer 34 is formed over source/drain regions 25c and over wordline 24c. Oxide layer 34 can be formed by a number of methods, including, for example, chemical vapor deposition.

Figure 8:
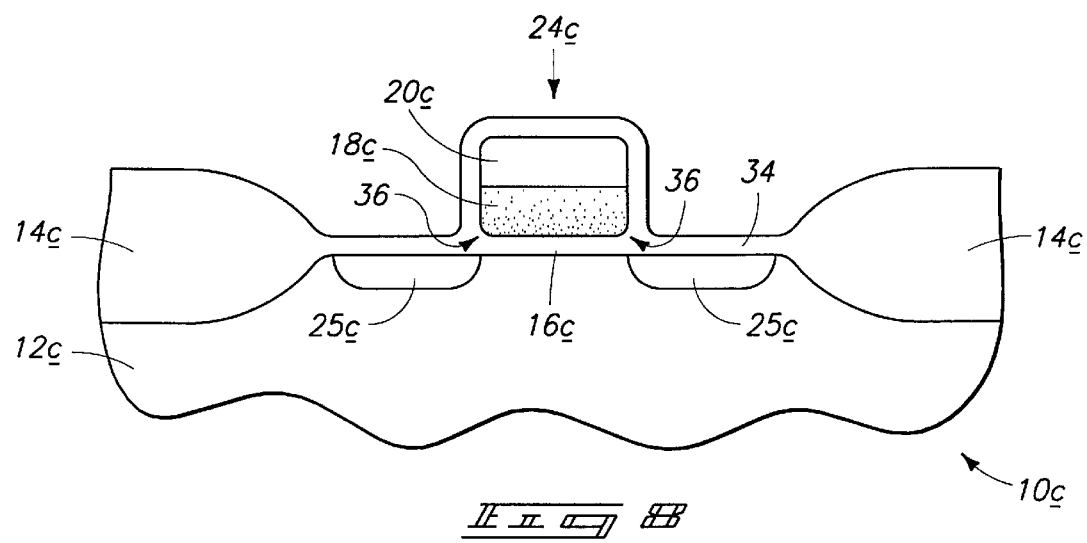
FIG. 8 illustrates the FIG. 5 wafer fragment at a step subsequent to that of FIG. 7.

Referring to FIG. 8, wafer fragment 10c is subjected to thermal processing within an oxidizing atmosphere to form rounded corners 36 adjacent gate oxide 18c. The oxidizing atmosphere can comprise, for example, $O_2$, $N_2O$, or NO. The temperatures utilized for forming rounded corners 36 are typically above 850° C., and commonly from 800° C. to 1050° C. As discussed above, wordline 24c will preferably be processed at temperatures of greater than about 850° C. to activate dopant within layer 18c and to form a low resistivity form of silicide layer 20c. In applications in which the temperature utilized for forming rounded corners 36 equals or exceeds such preferable processing temperature of wordline 24c, the preferable thermal processing of wordline 24c can occur in a common step with the formation of rounded corners 36. The formation of rounded corners 36 generates a so-called "smiling gate" structure which, as recognized by those of skill in the art, can reduce hot electron degradation.

A second embodiment of the invention is described with reference to FIGS. 10 and 11. In describing the second embodiment, like numerals from the preceding discussion of the prior art are utilized where appropriate with differences being indicated by the suffix "d" or with different numerals.

Referring to FIG. 10, a wafer fragment 10d is illustrated at a preliminary step of a processing sequence of the second embodiment. Wafer fragment 10d comprises a semiconductive material substrate 12d, such as monocrystalline silicon. Field isolation regions 14d and gate dielectric layer 16d are over semiconductive material 12d. Field isolation regions 14d and gate dielectric layer 16d can comprise silicon dioxide.

A polysilicon layer 18d is over field isolation regions 14d and gate dielectric layer 16d. Polysilicon layer 18d preferably comprises conductively doped polysilicon, either homogeneously doped (as shown) or doped in a gradient, such as the gradient described previously with reference to FIGS. 5–9.

A substantially fluorine impervious barrier layer 38 is formed over polysilicon layer 18d. Substantially fluorine impervious barrier layer 38 preferably has a thickness of less than or equal to about 20 Å, and preferably comprises a dielectric material. Substantially fluorine impervious barrier layer 38 can comprise a number of materials, including, for example, a nitrogen-containing material, such a TiN, or an oxygen-comprising material, such as silicon dioxide.

A polycide layer 20d is formed over barrier layer 38. Polycide layer 20d comprises a metal silicide. Polycide layer 20d can comprise a metal deposited from a fluorine-containing reactant, such as, for example, a metal selected from the group consisting of tungsten (deposited from $WF_6$) and tantalum (deposited from $TaF_5$).

Barrier layer 38 inhibits fluorine migration from metal silicide layer 20d into gate dielectric layer 16d. Such fluorine migration into dielectric layer 16d can disadvantageously thicken layer 16d, particularly if layer 16d is a gate oxide. Thickening of dielectric layer 16d can reduce performance of a transistor using a conductive line or transistor gate formed over layer 16d. In the shown preferred embodiment, barrier layer 38 is formed at an interface of polysilicon layer 18d with metal silicide layer 20d. In spite of barrier layer 38, polycide layer 20d and polysilicon layer 18d remain in electrical contact. Specifically, barrier layer 38 is kept thin so that it does not destroy electrical conductivity between polycide layer 20d and polysilicon layer 18d.

Barrier layer 38 can be formed by a number of methods, including, for example, chemical vapor deposition of TiN, sputter deposition of TiN, implanting a layer of nitrogen at an upper surface of polysilicon layer 18d, growing a layer of silicon dioxide over an upper surface of layer 18d, and depositing a layer of silicon dioxide over layer 18d prior to formation of metal silicide layer 20d.

After formation of fluorine impervious barrier layer 38, the stack of layers 16d, 18d, 38 and 20d is preferably subjected to a temperature of at least 850° C. for at least 10 seconds to activate dopant within layer 18d. Preferably, this will comprise a RTP step in which the temperature of layer 18d is ramped to 850° C. at 7° C./second, and during which polycide layer 20d is exposed to an oxidizing atmosphere. Exposure to an oxidizing atmosphere can create a silicon dioxide layer 37 over polycide layer 20d.

Referring to FIG. 11, layers 18d, 38, 20d and 37 are patterned into the shape of a conductive line 24d over gate dielectric layer 16d. Source/drain regions 25d are formed proximate conductive line 24d such that wordline 24d comprises a transistor gate electrically connecting source/drain regions 25d. Although the RTP step is described as occurring before patterning layers 18d, 38 and 20d into wordline 24d, in alternative embodiments of the invention an RTP step could occur after such patterning.

After formation of wordline 24d, subsequent processing can be performed analogous to that of FIGS. 7 and 8 to form a smiling gate structure comprising fluorine impervious barrier layer 38. Most preferably, the steps of activating an impurity within layer 18d and forming a smiling gate structure comprising layer 38 will occur simultaneously. In such most preferable application, wordline 24d will be subjected to a temperature of at least 850° C. in an oxygen-comprising atmosphere to 1) activate an impurity within layer 18d; and 2) oxidize a corner of polysilicon gate layer 18d.

Figure 12:
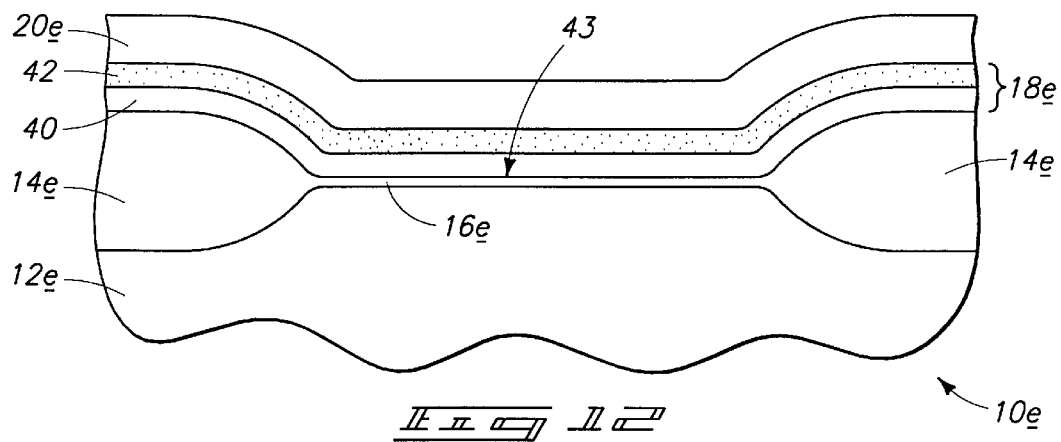
FIG. 12 illustrates a semiconductor wafer fragment at preliminary step of a third embodiment method of the present invention for forming a wordline.

Referring to FIG. 12, a semiconductor wafer fragment 10e is shown at a preliminary processing step in accordance with a third embodiment of the present invention. In describing the third embodiment, like numerals from the preceding discussion of the prior art are utilized where appropriate, with differences being indicated by the suffix "e" or with different numerals. The third embodiment can be utilized to, for example, improve gate oxide quality in flash devices and scaled CMOS.

Wafer fragment 10e comprises a semiconductive material substrate 12e. Field isolation regions 14e and a gate dielectric layer 16e are formed over semiconductive substrate material 12e. A substantially undoped silicon-comprising layer 40 is formed over isolation regions 14e and layer 16e. Substantially undoped silicon-comprising layer 40 preferably comprises less than $1 \times 10^{18}$ ions/cm$^3$ of dopant, and most preferably comprises 0 ions/cm$^3$ of dopant. Layer 40 is preferably formed to a thickness of from about 50 Angstroms to about 300 Å, and preferably is originally formed as amorphous silicon. An example method for forming an amorphous silicon layer 40 includes chemical vapor deposition utilizing $SiH_4$ at a temperature of 480 degrees to 560° C. under a pressure of from 50 millitorr to about 2 torr in a batch furnace. Alternatively, layer 40 can be deposited as polysilicon. An interface 43 exists at a common boundary of layers 40 and 16e.

A conductively doped silicon-comprising layer 42 is formed over substantially undoped silicon-comprising layer 40. Layer 42 is most preferably heavily doped with a conductivity enhancing impurity to a concentration of greater than $1\times10^{20}$ atoms/cm$^3$. Layer 42 will preferably comprise a thickness of from about 400 Å to about 1500 Å, and can be either amorphous or polycrystalline. An example method for depositing a substantially amorphous layer 42 includes chemical vapor deposition utilizing SiH$_4$, in combination with a dopant feed gas comprising at least one of PH$_3$ or AsH$_3$. Doped layer 42 can also be formed by depositing an undoped layer of silicon and subsequently implanting dopant into the layer. Doped layer 42 can be deposited at a temperature common to the temperature at which undoped layer 40 is deposited. Together, layers 40 and 42 comprise a gate layer 18e.

A refractory metal layer 20e is provided on gate layer 18e. Refractory metal layer 20e can comprise, for example, tungsten, cobalt, molybdenum or titanium. Of course, in embodiments in which gate layer 18e is to be incorporated as a floating gate, refractory metal layer 20e would not be provided on layer 18e.

Figure 13:
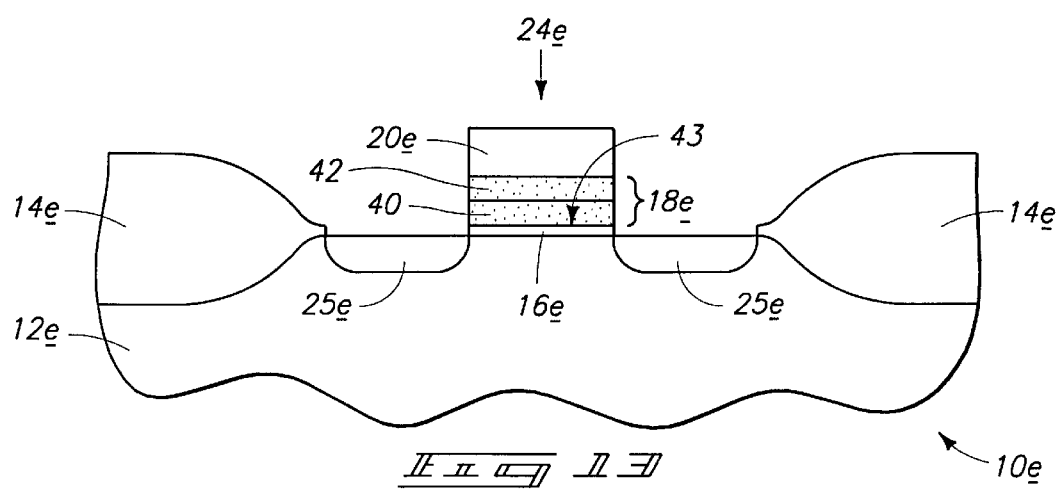
FIG. 13 illustrates the FIG. 12 wafer fragment at a step subsequent to that of FIG. 12.
Figure 14:
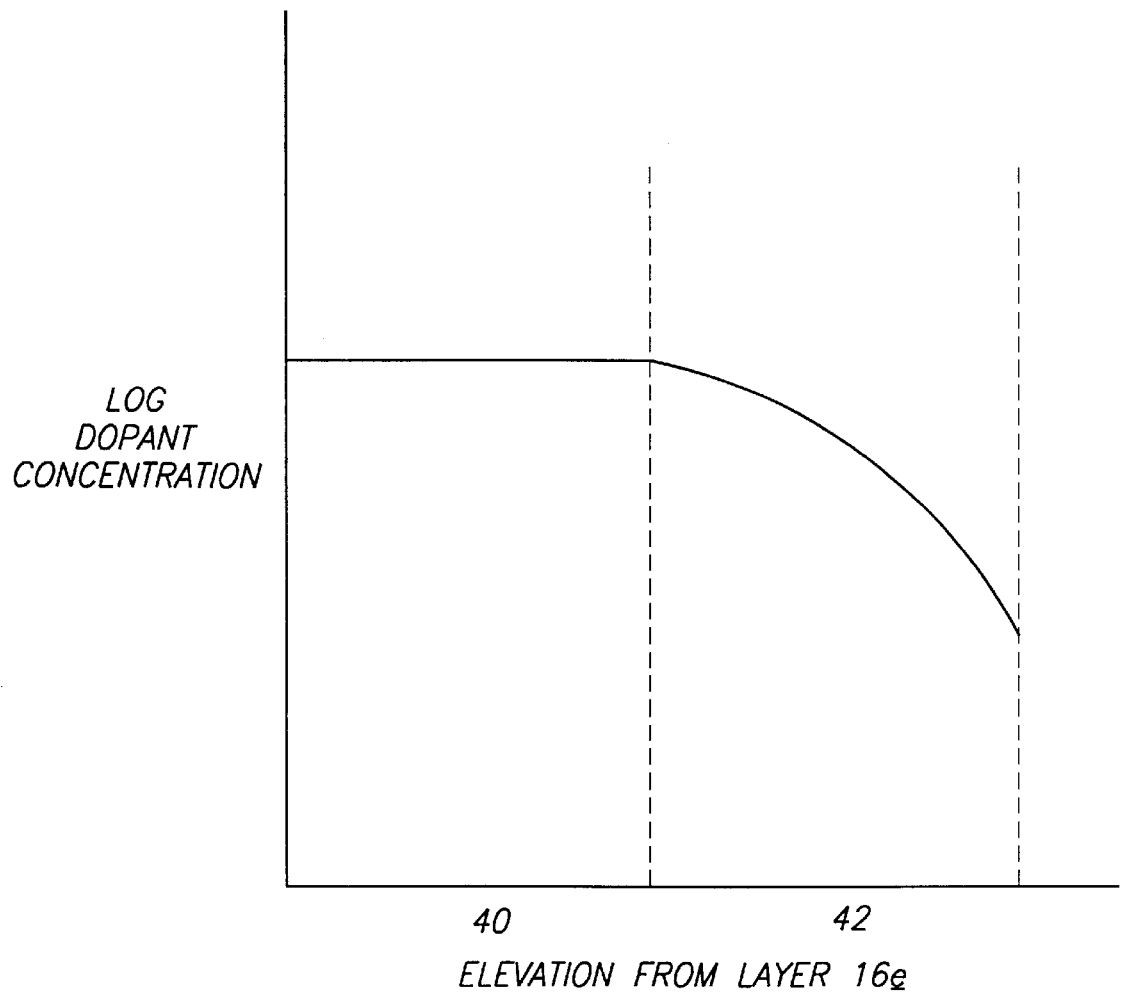
FIG. 14 illustrates a graph of dopant concentration verses elevation for an exemplary polysilicon layer doped according to a method of the present invention.

Referring to FIG. 13, layers 16e, 18e and 20e are patterned to form a conductive line 24e, and subjected to an anneal. Preferably, the anneal comprises the above-described RTP, and includes processing to a temperature of at least 850° C. for at least 10 seconds. Most preferably the anneal occurs at a temperature of 850° C. for thirty minutes in a nitrogen-comprising atmosphere. Alternatively, the anneal can comprise RTP in an oxygen-comprising atmosphere. In embodiments in which layers 40 and 42 comprise amorphous silicon, the anneal can crystallize such layers to convert them to polysilicon. The anneal can also activate dopant, as well as diffuse dopant from heavily doped layer 42 into substantially undoped layer 40 (as shown by the stippling extending throughout both of layers 40 and 42 in FIG. 13). After such diffusion of dopant, there can remain a dopant gradient within layer 18e which is heaviest in layer 42 and decreases through layer 40 (shown schematically in a graph of FIG. 14, with regions 40 and 42 labeled on the x-axis), or there can be uniform dopant concentration throughout layer 18e (as shown in FIG. 13), depending on the degree of the anneal.

It is noted that while it is highly desirable in a transistor gate to have a large quantity of dopant material at interface 43 where conductive gate material 18e joins underlying gate dielectric layer 16e, it is also highly desirable that the dopant be "active" as opposed to "non-active" in this region. Non-active phosphorate dopant can adversely impact transistor operation where such collects or agglomerates at interface 43. The present invention, in a preferred aspect, substantially keeps dopant away from interface 43 until the dopant has been activated by the above-indicated anneal step.

The optimal thickness of substantially undoped layer 40 is determined by the dopant concentration of layer 42 as well as by the post deposition thermal budget which controls the diffusion of dopant to oxide/gate layer interface 43. An example thickness of layer 40 is from about 50 Å to about 300 Å.

A fourth embodiment of the invention is described with reference to FIGS. 15 and 16. In describing the fourth embodiment, like numerals from the preceding discussion of the prior art are utilized where appropriate with differences being indicated by the suffix "f" or with different numerals.

Figure 15:
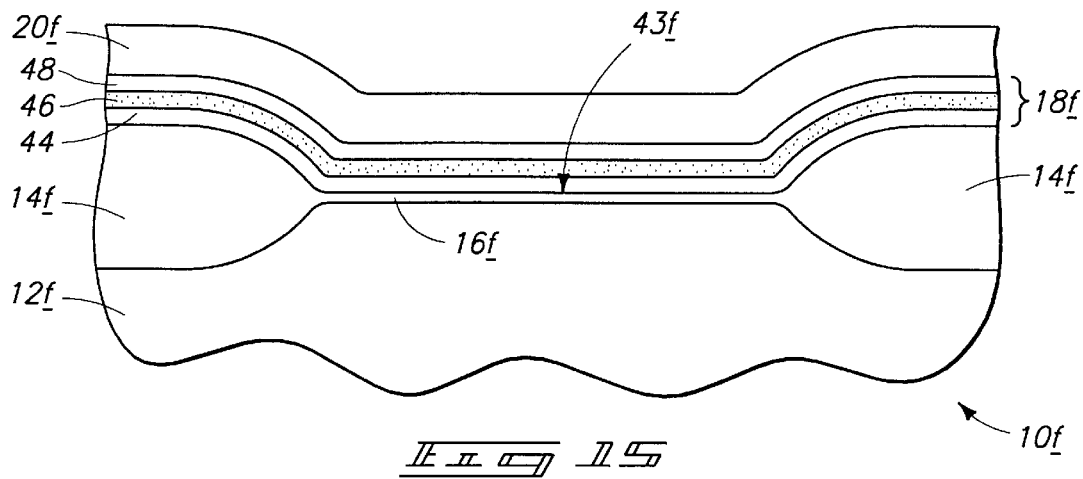
FIG. 15 illustrates a semiconductor wafer fragment at preliminary step of a fourth embodiment method of the present invention for forming a wordline.

Referring to FIG. 15, a semiconductor wafer fragment 10f is illustrated at a preliminary processing step in accordance with the fourth embodiment of the invention. Wafer fragment 10f comprises a semiconductive material substrate 12f having field isolation regions 14f and a gate dielectric layer 16f formed thereover. A first substantially undoped silicon-comprising layer 44 is formed over regions 14f and dielectric layer 16f. A doped silicon-comprising layer 46 is formed over substantially undoped layer 44, and a second substantially undoped silicon-comprising layer 48 is formed over doped layer 46. Together, layers 44, 46 and 48 form a gate layer 18f. Substantially undoped layers 44 and 46 preferably comprise less than $1\times10^{18}$ ions/cm$^3$ of dopant, and most preferably comprise 0 ions/cm$^3$ of dopant. An interface 43f exists at a common boundary of layer 44 and 16f.

The optimal thickness of undoped layers 44 and 48 can be determined by the dopant concentration of layer 46 as well as by the post deposition thermal budget which controls the diffusion of dopant throughout layers 44, 46 and 48. An example thickness of layers 44 and 48 is from about 50 Å to about 300 Å.

Layers 44, 46 and 48 can be formed by a number of methods, including chemical vapor deposition methods similar to those described above with reference to FIGS. 12 and 13. In such deposition methods, layers 44, 46 and 48 can be deposited at a common temperature. Preferably, layers 44, 46 and 48 will be formed as amorphous silicon, and subsequently converted to polysilicon with an anneal comprising 850° C. for at least 10 seconds, and more preferably comprising 850° C. for about 30 minutes. Most preferably, the anneal will comprise rapid thermal processing, which advantageously converts the dopant in layer 46 from an inactive form to an active form. Also preferably, the anneal will disperse dopant from layer 46 into layers 44 and 48 (as shown by the stippling throughout layers 44, 46 and 48 in FIG. 16).

Alternative methods of forming layers 44, 46 and 48 can comprise depositing one or more of the layers as polysilicon. For instance, layers 44 and 48 can be deposited as amorphous silicon, with layer 46 deposited as polysilicon. Polysilicon layer 46 can be doped either subsequent to deposition, or doped in situ during deposition. If polysilicon layer 46 is doped subsequent to deposition, the layer can be doped, for example, by an ion implant of dopant into layer 46. Such ion implant can occur before or after formation of layer 48.

A polycide layer 20f can be formed over undoped layer 48, but is not formed if layer 48 is utilized as a floating gate. Polycide layer 20f comprises a metal silicide, and can comprise, for example, tungsten silicide, cobalt silicide, molybdenum silicide, or titanium silicide. Polycide layer 20f is preferably formed by forming a refractory metal layer over silicon-comprising layer 48 prior to the above-described anneal. The anneal then forms metal-silicide layer 20f while activating and dispersing dopant.

Figure 16:
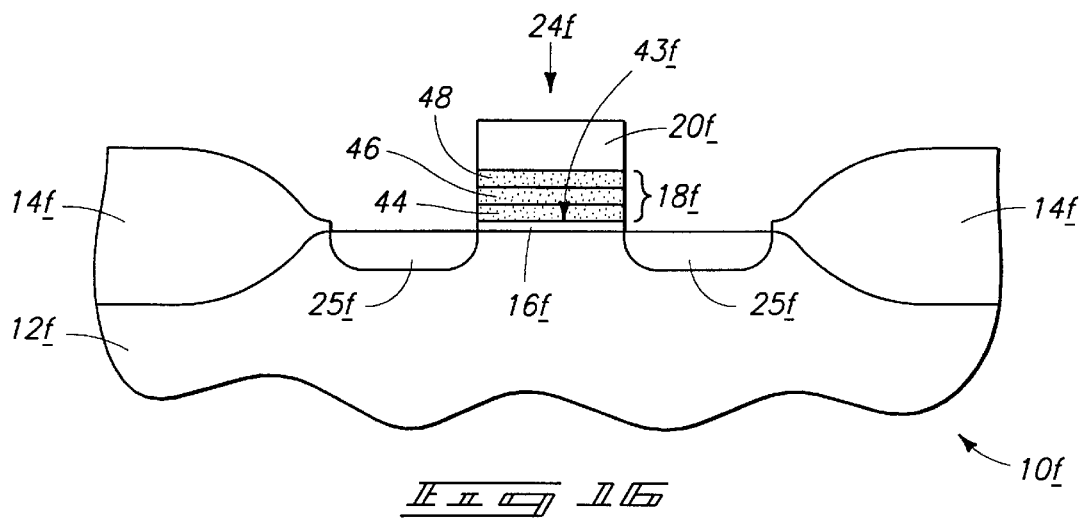
FIG. 16 illustrates the FIG. 15 wafer fragment at a step subsequent to that of FIG. 15.

Referring to FIG. 16, layers 16f, 44, 46, 48 and 20f are patterned to form a conductive line 24f and source/drain regions 25f are formed proximate conductive line 24f.

In a preferred aspect, the embodiment of FIGS. 15 and 16 substantially keeps dopant away from interface 43f until the dopant has been activated by an anneal step. The embodiment of FIGS. 15 and 16 thus preferably prevents non-active dopant from collecting at interface 43f and thereby adversely impacting transistor operation, and yet the embodiment permits active dopant to advantageously be formed at interface 43f. In another preferred aspect, the embodiment of FIGS. 15 and 16 substantially keeps dopant away from polycide layer 20f during grain growth within layer 20f. If dopant is present within a polycide layer during grain growth, the dopant can disadvantageously disrupt the grain growth.

A fifth embodiment of the invention is described with reference to FIGS. 17 and 18. In describing the fifth embodiment, like numerals from the preceding discussion of the prior art are utilized where appropriate, with differences being indicated by the suffix "g" or different numerals.

Referring to FIG. 17, a semiconductor wafer fragment 10g is illustrated at a preliminary step of the fifth embodiment. Wafer fragment 10g comprises a semiconductive material substrate 12g having field isolation regions 14g and a gate dielectric layer 16g formed thereover. A silicon-comprising layer 18g is formed over isolation regions 14g and dielectric layer 16g. Silicon-comprising layer 18g can comprise amorphous silicon or polysilicon. Preferably, layer 18g comprises amorphous silicon. Within layer 18g is provided a precisely formed layer of dopant (indicated by the stippling), approximately elevationally-centered within layer 18g. The dopant can be provided, for example, by careful ion implanting of dopant into layer 18g. Alternatively, the dopant can be provided in situ during deposition of layer 18g. An interface 43g exists at a common boundary of layers 18g and 16g. A polycide layer 20g can be provided over polysilicon layer 18g, but is not provided if layer 18g is utilized as a floating gate.

As will be appreciated by persons of ordinary skill in the art, the fifth embodiment of FIG. 17 can be effectively identical to the embodiment of FIG. 15, with the exception being that polysilicon layer 18g is deposited as a single uniform layer and subsequently doped by ion implanting, rather than being deposited as a distinct doped layer over a distinct undoped layer. As will be further appreciated by persons of ordinary skill in the art, the dopant within layer 18g can be implanted either towards the center of 18g, to form a layer effectively equivalent to layer 18f (shown in FIGS. 15 an 16), or can be implanted towards an elevationally upper region of 18g to form a layer more effectively equivalent to layer 18e (shown in FIGS. 12 and 13).

Referring to FIG. 18, layers 16g, 18g and 20g are patterned to form conductive line 24g. Also, layer 18g is subjected to thermal processing to disperse the dopant throughout layer 18g. The dopant can end up uniformly dispersed throughout layer 18g (as shown), or can be dispersed in a gradient within layer 18g. Preferably, the thermal processing converts the dopant to an active form. Most preferably, the thermal processing comprises rapid thermal processing to a temperature of greater than 850° C. for a time greater than 10 seconds.

In a preferred aspect, the embodiment of FIGS. 17 and 18 substantially keeps dopant away from interface 43g until the dopant has been activated by an anneal step. The embodiment of FIGS. 17 and 18 thus preferably prevents non-active dopant from collecting at interface 43g and thereby adversely impacting transistor operation, and yet the embodiment permits active dopant to advantageously be formed at interface 43g. In another preferred aspect, the embodiment of FIGS. 17 and 18 substantially keeps dopant away from polycide layer 20g during grain growth within layer 20g.

As will be appreciated by persons of ordinary skill in the art, the various embodiments described herein can be combined to form alternative embodiments which are not specifically illustrated. For instance, a fluorine-impermeable barrier layer (described with reference to FIGS. 10–11) can be combined with the careful dopant placement within a polysilicon layer (described with reference to FIGS. 12–13, 15–16, and 17–18; respectively).

In yet another aspect of the invention, it is recognized that the structures described herein can be used as conductive interconnects. Such conductive interconnects could, for example, comprise the polycide layers (20c–g) and gate layers (18c–g) of the illustrated wordlines (24c-g), and lack the shown gate dielectric layers (18c–g).

In yet another aspect of the invention, it is recognized that one or more of the embodiments described herein can be utilized in formation of the conductive line or floating gate of a programmable-read-only-memory (PROM) device.

To aid in interpretation of the claims that follow, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A transistor gate comprising:
   a gate layer of polysilicon comprising a gradient of dopant concentration that decreases with increasing elevation across an entirety of a thickness of the gate layer;
   a substantially fluorine impervious barrier layer over the gate layer; and
   a layer of metal-silicide over the substantially fluorine impervious barrier layer.

2. The transistor gate of claim 1 wherein the substantially fluorine impervious barrier layer comprises TiN.

3. The transistor gate of claim 1 wherein the substantially fluorine impervious barrier layer comprises nitrogen.

4. A wordline comprising:
   a polysilicon line comprising a gradient dopant concentration that decreases with increasing elevation across an entirety of a thickness of the polysilicon line;
   a substantially fluorine impervious barrier layer over the polysilicon line, the barrier layer comprising an oxygen-comprising material; and
   a layer of metal-silicide over the substantially fluorine impervious barrier layer.

5. The wordline of claim 4 wherein the substantially fluorine impervious barrier layer comprises silicon dioxide.

6. A transistor gate comprising:
   a gate dielectric layer over a substrate;
   a first doped polysilicon layer over the gate dielectric layer; and
   a second doped polysilicon layer over the first doped polysilicon layer, the second doped polysilicon layer comprising a gradient of dopant concentration that decreases with increasing elevation across an entirety of a thickness of the second doped polysilicon layer.

7. The transistor gate of claim 6 further comprising a metal-suicide layer over the doped polysilicon layers.

8. The transistor gate of claim 6 wherein the transistor gate is devoid of a metal-suicide layer.

9. The transistor gate of claim 6 further comprising a floating gate devoid of a metal-suicide layer.

10. A wordline comprising:

a gate dielectric layer over a substrate;

a line of substantially undoped polysilicon over the gate dielectric layer;

a line of doped polysilicon over the line of substantially undoped polysilicon, the line of doped polysilicon comprising a gradient of dopant concentration that decreases with increasing elevation across an entirety of a thickness of the line of doped polysilicon; and a substantially fluorine impervious barrier layer over the gate dielectric layer.

11. The wordline of claim 10 wherein the barrier layer comprises an oxygen-comprising material.

12. The wordline of claim 10 wherein the barrier layer comprises silicon dioxide.

13. A conductive interconnect comprising:

a first line of doped polysilicon over a substrate and comprising a gradient of dopant concentration that decreases with increasing elevation across an entirety of a thickness of the first line of doped polysilicon;

a second line of doped polysilicon on the first line of doped polysilicon, the first and second lines of doped polysilicon comprising a gradient of dopant concentration across a thickness of the first and second lines of doped polysilicon; and a metal-silicide layer over the first and second lines of doped polysilicon.

14. A programmable-read-only-memory device comprising:

a first dielectric layer over a substrate;

a floating gate over the first dielectric layer;

a second dielectric layer over the floating gate;

a conductive line over the second dielectric layer;

a metal-silicide layer over the conductive line; and the conductive line comprising:

a first substantially undoped polysilicon layer; and a doped polysilicon layer over the first substantially undoped polysilicon layer.

15. The programmable-read-only-memory device of claim 14 wherein the device is an EPROM.

16. The programmable-read-only-memory device of claim 14 wherein the device is an EEPROM.

* * * * *

UNITED STATES PATENT AND TRADEMARK OFFICE
CERTIFICATE OF CORRECTION

PATENT NO. : 6,611,032 B2
DATED : August 26, 2003
INVENTOR(S) : Schuegraf et al.

It is certified that error appears in the above-identified patent and that said Letters Patent is hereby corrected as shown below:

<u>Column 3,</u>
Line 63, please delete "16c" after "layer" and insert -- 18c --.

<u>Column 4,</u>
Line 11, please delete "18c" after "layer" and insert -- 16c --.
Line 31, please delete "18c" after "layers" and insert -- 16c --.

<u>Column 5,</u>
Line 10, please delete "18c" after "oxide" and insert -- 16c --.

<u>Column 11,</u>
Lines 2, 4 and 6, please delete "suicide" after "metal-" and insert -- silicide --.

Signed and Sealed this

Twenty-fourth Day of February, 2004

JON W. DUDAS
*Acting Director of the United States Patent and Trademark Office*